United States Patent [19]

Mira

[11] Patent Number: 5,662,163

[45] Date of Patent: Sep. 2, 1997

[54] READILY REMOVABLE HEAT SINK ASSEMBLY

[75] Inventor: Ali Mira, San Jose, Calif.

[73] Assignee: Silicon Graphics, Inc., Mountain View, Calif.

[21] Appl. No.: 564,404

[22] Filed: Nov. 29, 1995

[51] Int. Cl.⁶ .................................................. F28F 7/00
[52] U.S. Cl. .................. 165/80.3; 165/185; 174/16.3; 257/718; 257/719; 361/704; 361/707; 361/719; 361/720
[58] Field of Search ........................... 165/80.3, 80.2, 165/185; 174/16.3; 257/718, 719; 361/704, 707, 709, 710, 715, 717–720

[56] References Cited

U.S. PATENT DOCUMENTS

| | | | |
|---|---|---|---|
| 3,593,064 | 7/1971 | Wagner et al. | 361/707 |
| 4,621,304 | 11/1986 | Oogaki et al. | 361/720 |
| 4,731,699 | 3/1988 | Nitta et al. | 361/718 |
| 4,871,015 | 10/1989 | Foley et al. | 165/80.3 X |
| 5,014,777 | 5/1991 | Sano | 165/185 |
| 5,065,279 | 11/1991 | Lazenby et al. | 361/720 |
| 5,134,545 | 7/1992 | Smith . | |
| 5,162,975 | 11/1992 | Matta et al. | 361/720 |
| 5,473,510 | 12/1995 | Dozier, II | 361/719 |

FOREIGN PATENT DOCUMENTS 3509734  9/1985  Germany ........................... 361/704

Primary Examiner—Leonard R. Leo
Attorney, Agent, or Firm—Wagner, Murabito & Hao

[57] ABSTRACT

A readily attachable and detachable heat sink assembly apparatus and method. In one embodiment of the present invention, a backing plate has alignment pins extending therefrom. The backing plate is adapted to be located next to the back surface of a printed circuit board, and have the alignment pins extend through the holes in the printed circuit board. A heat sink unit is adapted to thermally contact a heat generating device located on a front surface of the printed circuit board. The heat sink unit also has holes formed therethrough which are adapted to allow the alignment pins of the backing plate extend through the heat sink unit. A clasp plate is adapted to be located on top of the heat sink unit and has slits which are configured to grasp the ends of the alignment pins. A fastener coupled to the clasp plate fastener is adapted to release the heat sink unit from the heat generating device or tightly attach the heat sink unit to the heat generating device. In so doing, the heat sink unit can be attached to or detached from the heat generating device without having to have access to the back surface of the printed circuit board.

20 Claims, 5 Drawing Sheets

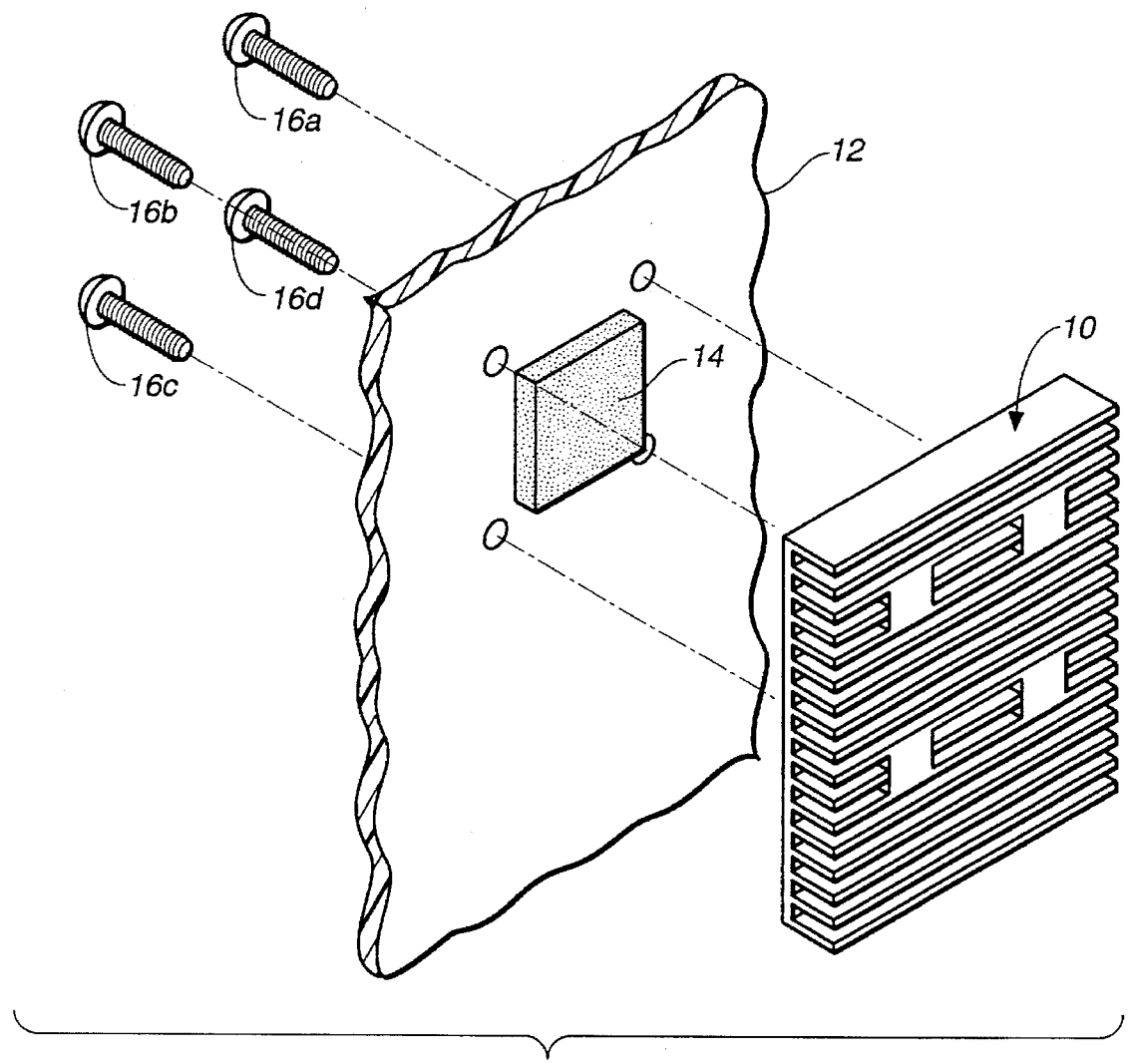
FIG._1
(PRIOR ART)
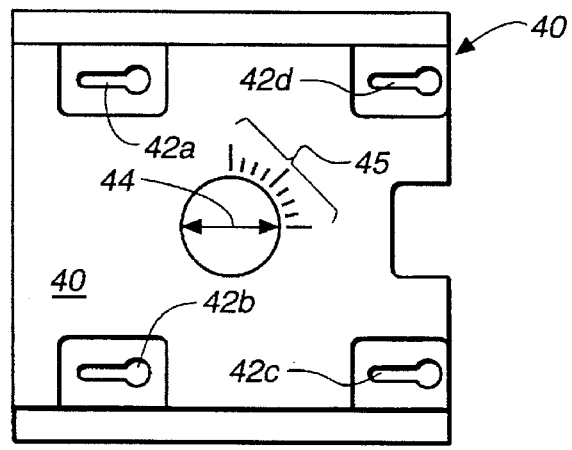
FIG._7

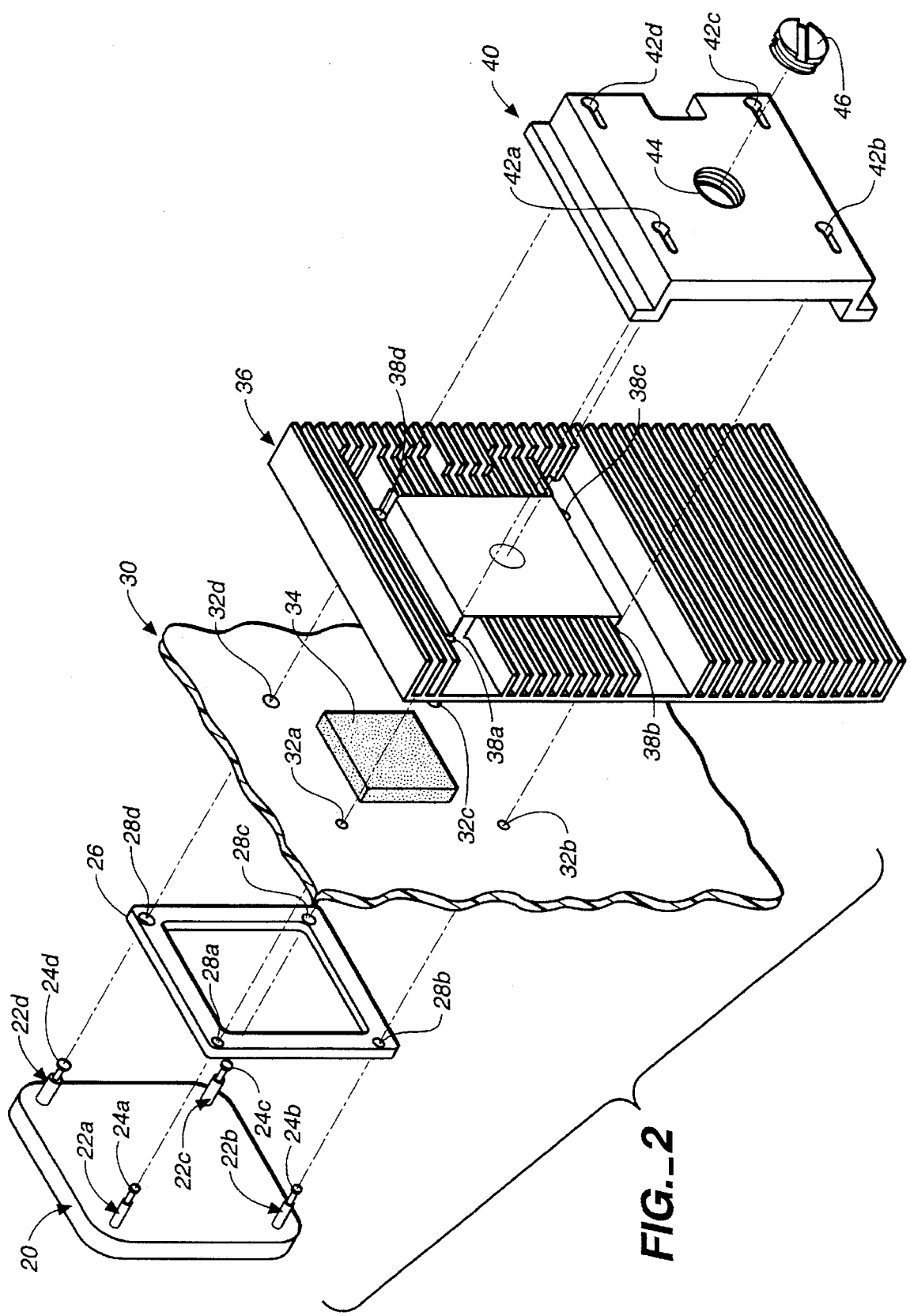
FIG._2

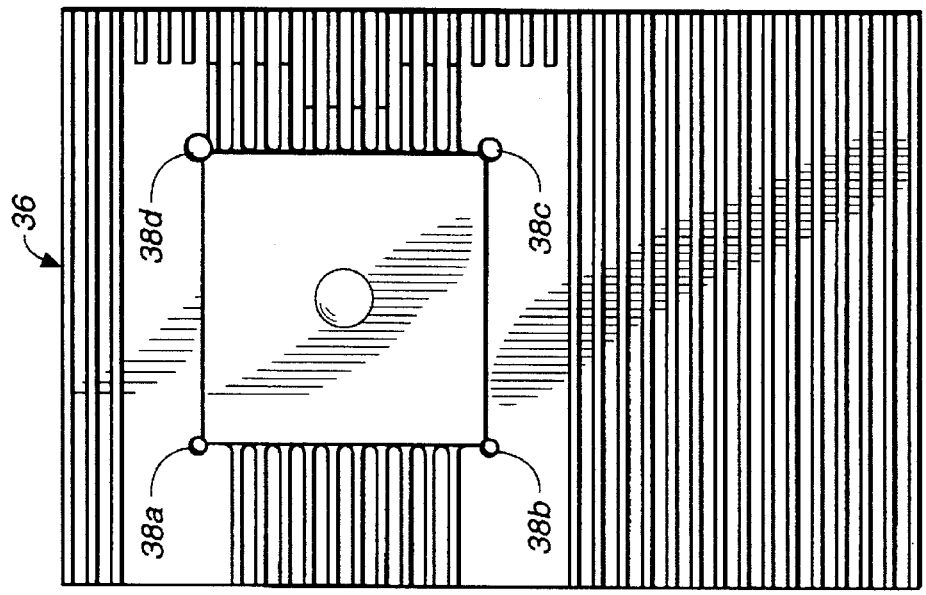
FIG._6
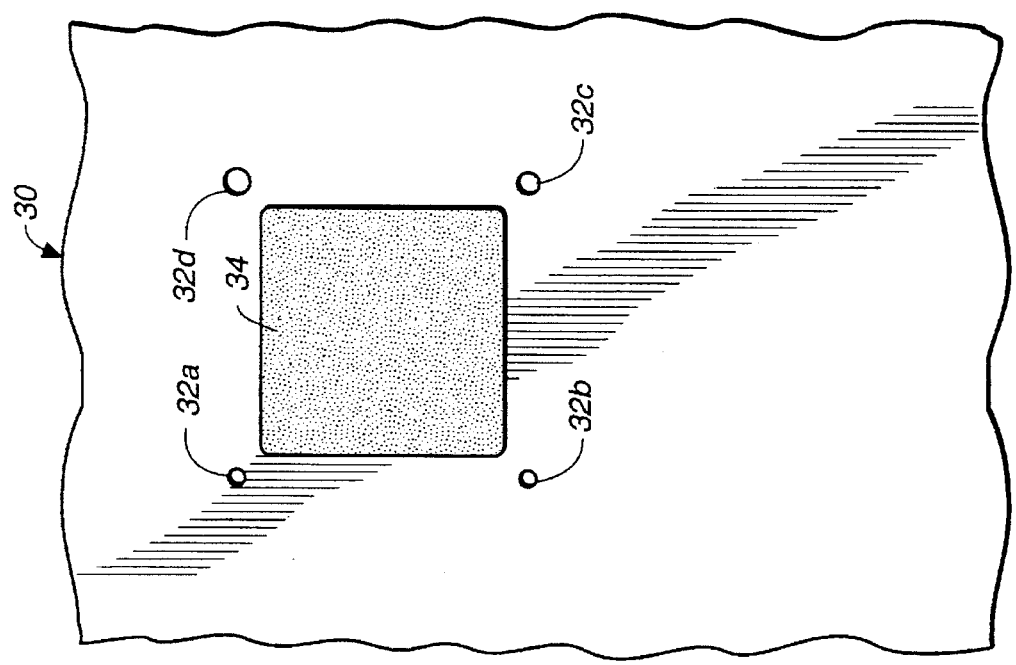
FIG._5
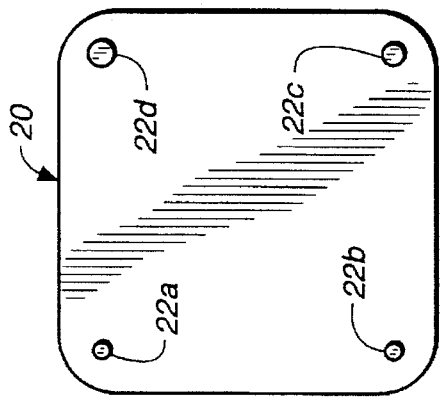
FIG._3
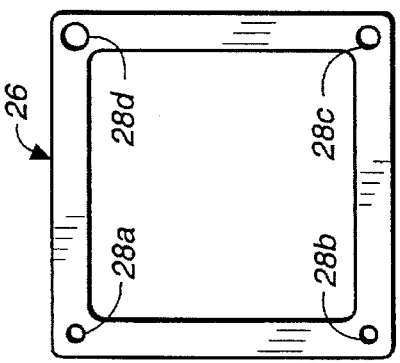
FIG._4

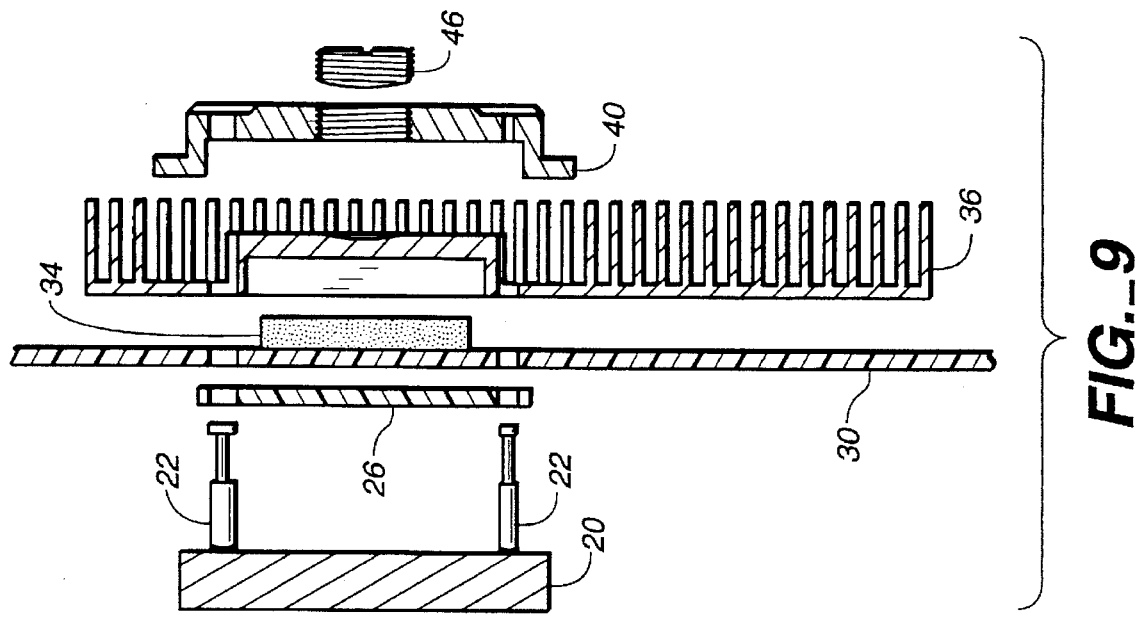
FIG._9
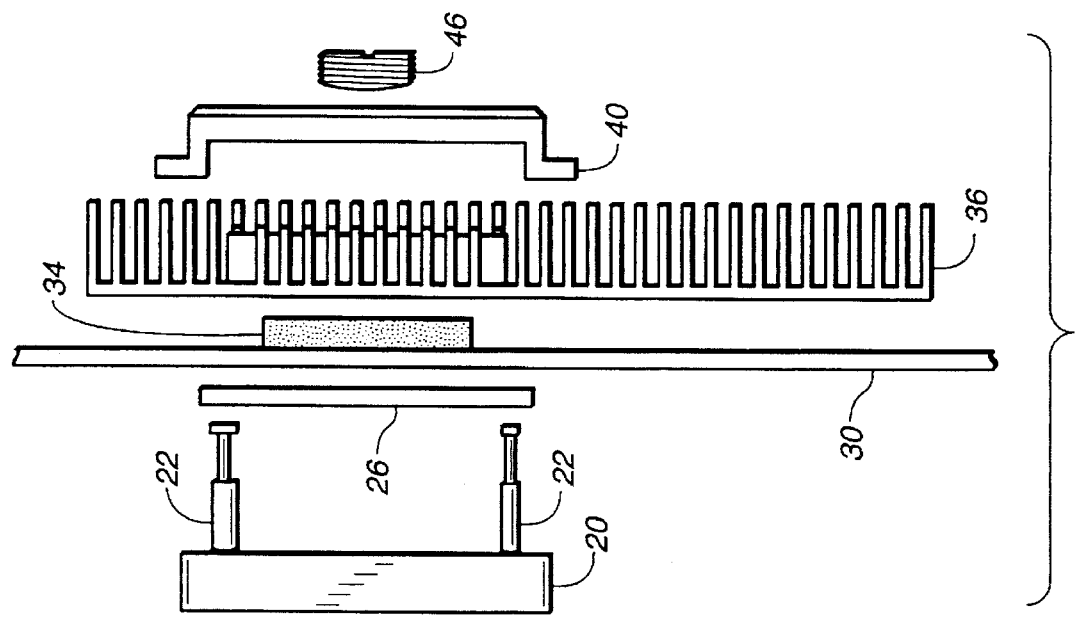
FIG._8

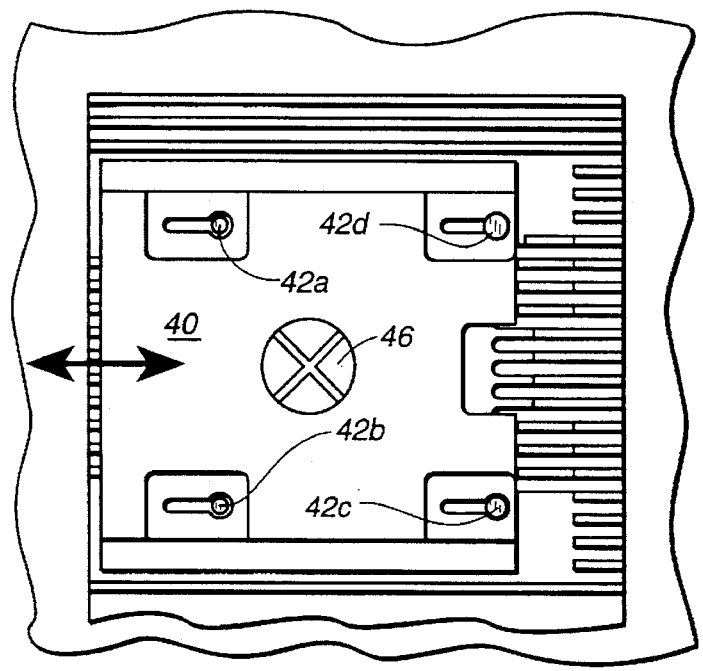
FIG._10
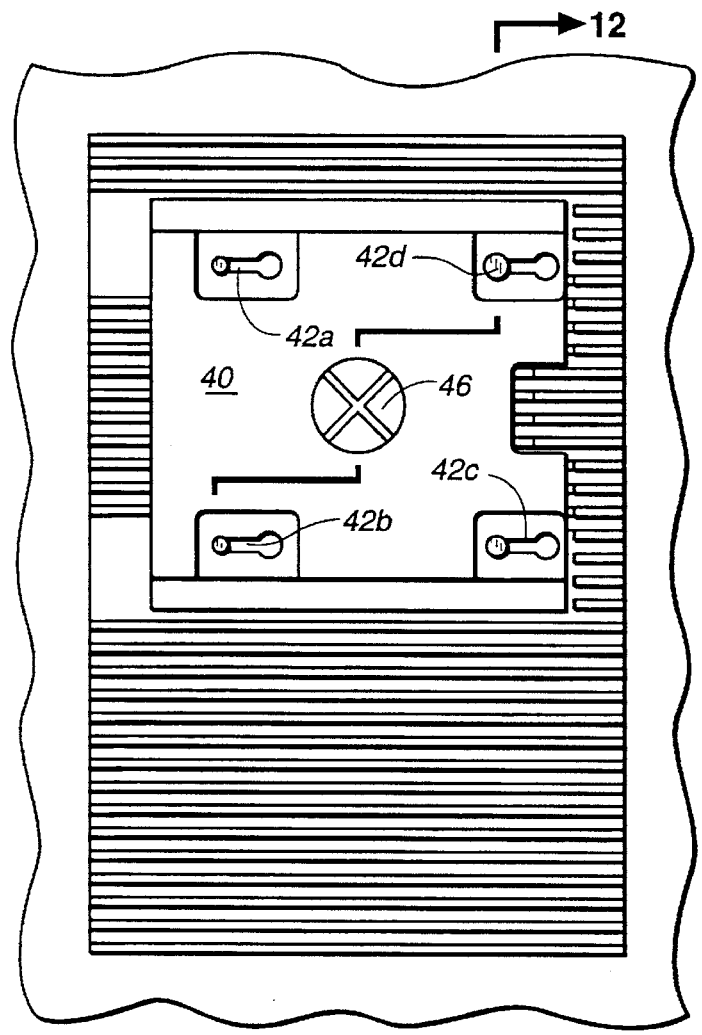
FIG._11
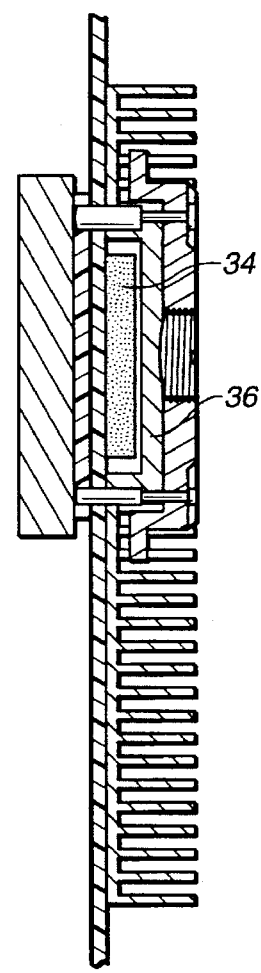
FIG._12

READILY REMOVABLE HEAT SINK ASSEMBLY

TECHNICAL FIELD

This invention relates to heat removal devices. Specifically, the present invention relates to a heat sink assembly used to remove excess heat from an integrated circuit chip.

BACKGROUND ART

It is well known that integrated circuit chips are becoming increasingly complex with correspondingly crowded circuit architectures. However, such crowded architectures often result in an unwanted increase in heat generation. For example, some integrated circuit chips currently generate as much as 40–50 watts of power on a 1-inch by 1-inch surface. The excess heat generated by such chips will destroy or burn-up the chip if not removed. Thus heat sinks are commonly attached to the chips to remove excess heat.

As shown in Prior Art FIG. 1, a heat sink 10 is often directly attached to the printed circuit board 12 on which a chip 14 is mounted. Heat sink 10 is attached to printed circuit board 12 using one or more screws 16a–16d. The screws 16a–16d are inserted from the back surface of printed circuit board 12 and are screwed into heat sink 10 residing on the front surface of printed circuit board 12.

However, prior art heat sinks are typically bulky, unwieldy, and completely prevent access to the chip. Access to the chip is repeatedly required, for example, for repair, testing, or replacement of the chip. Furthermore, many computer systems and test consoles have access ports built therein to provide access to chip. However, as shown in Prior Art FIG. 1, heat sink 10 cannot be removed from chip 14 without first unscrewing screws 16a–16d. Thus, the back surface of printed circuit board 12 must be accessed to unscrew screws 16a–16d holding the heat sink in place. Thus, the access ports are not always useful.

Furthermore, in many instances, very little space is present near the back surface of the printed circuit board. In such instances, the entire printed circuit board must be removed to gain access to the screws. Removing the entire printed circuit board is a time consuming task which is inconvenient and which costs money in wasted man-hours.

As an additional drawback, screws used in prior art systems do not always uniformly attach the heat sink to the chip. That is, if all of the screws are not tightened to the same extent, the heat sink may not uniformly contact the surface of the chip.

Thus, a need exists for a heat sink unit or assembly which can be attached to or detached from a chip without accessing the back surface of the printed circuit board on which the chip is mounted. A further need exists for a heat sink unit or assembly which insures uniform contact between a chip and a heat sink.

DISCLOSURE OF THE INVENTION

It is therefore an object of the present invention to provide a heat sink unit or assembly which can be attached to or detached from a chip without accessing the back surface of the printed circuit board on which the chip is mounted, and a heat sink unit or assembly which insures uniform contact between a chip and a heat sink. The above object has been achieved by a readily removable heat sink assembly having a backing plate, a heat sink unit, a clasp plate, and a fastener.

A readily attachable and detachable heat sink assembly apparatus is disclosed. In one embodiment of the present invention, a backing plate has alignment pins extending therefrom. The backing plate is adapted to be located next to the back surface of a printed circuit board, and have the alignment pins extend through the holes in the printed circuit board. A heat sink unit is adapted to thermally contact a heat generating device located on a front surface of the printed circuit board. The heat sink unit also has holes formed therethrough which are adapted to allow the alignment pins of the backing plate extend through the heat sink unit. A clasp plate is adapted to be located on top of the heat sink unit contains slits which are configured to grasp the ends of the alignment pins. A fastener coupled to the clasp plate fastener is adapted to release the heat sink unit from the heat generating device or tightly attach the heat sink unit to the heat generating device. In so doing, the heat sink unit can be attached to or detached from the heat generating device without having to have access to the back surface of the printed circuit board. Furthermore, the fastener uniformly compresses the heat sink unit against the heat generating device.

Specifically, in one embodiment, the present invention includes the above described features but also has one of the alignment pins having a size which is different than the size of the other alignment pins. Likewise, one of the first holes in the printed circuit board, one of the second holes in the heat sink unit, and one of the slits in the clasp plate has a size that is different than the size of the other holes or slits. The differently sized holes and slit are aligned with each to allow the differently sized alignment pin to extend therethrough In so doing, the backing plate, the heat sink unit, and the clasp plate are oriented in a particular direction with respect to, the printed circuit board when the alignment pins extend through the printed circuit board, the backing plate, the heat sink unit, and the clasp plate.

In another embodiment, the present invention includes the above described features and further includes a gasket adapted to be disposed between the backing plate and the printed circuit board. The gasket has third holes formed therethrough that are aligned with the holes or slits in the backing plate, the printed circuit board, the heat sink trait, and the clasp plate. The present invention also includes an embodiment wherein a thermally conductive pad is adapted to be disposed between the heat generating device and the heat sink unit to insure thermal contact between the heat generating device and the heat sink unit.

A method for readily attaching and detaching a heat sink assembly in accordance with the above described apparatus is also disclosed.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is an exploded perspective view of a prior art heat sink assembly.

FIG. 2 is an exploded perspective view of a readily removable heat sink assembly in accordance with the present claimed invention.

FIG. 3 is a top plan view of the backing plate of FIG. 2 in accordance with the present claimed invention.

FIG. 4 is a top plan view of the gasket of FIG. 2 in accordance with the present claimed invention.

FIG. 5 is a top plan view of the substrate and attached heat generating device of FIG. 2 in accordance with the present claimed invention.

FIG. 6 is a top plan view of the heat sink unit of FIG. 2 in accordance with the present claimed invention.

FIG. 7 is a top plan view of the clasp plate of FIG. 2 in accordance with the present claimed invention.

FIG. 8 is a side view of the exploded heat sink assembly of FIG. 2 in accordance with the present claimed invention.

FIG. 9 is a side sectional view of the exploded heat sink assembly of FIG. 2 taken through the midportion of the heat sink assembly in accordance with the present claimed invention.

FIG. 10 is a top plan view of the assembled heat sink assembly of FIG. 2 with the heads of the alignment pins in the wide end of the slits of the clasp plate in accordance with the present claimed invention.

FIG. 11 is a top plan view of the assembled heat sink assembly of FIG. 2 with the heads of the alignment pins grasped by the narrow ends of the slits of the clasp plate in accordance with the present claimed invention.

FIG. 12 is a side sectional view of the assembled heat sink assembly of FIG. 2 taken through the midportion of the heat sink assembly in accordance with the present claimed invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

With reference now to FIG. 2, an exploded perspective view of a readily removable heat sink assembly in accordance with the present claimed invention is shown. The following description of the present invention will begin with a detailed description of the physical characteristics of the present invention. This description will then be followed by a detailed description setting forth the operation of the present invention. Regarding the physical characteristics of the present embodiment, the heat sink assembly includes a backing plate 20 having alignment pins 22a–22d extending therefrom. Each of alignment pins 22a–22d has a head 24a–24d, respectively, located on the distal thereof. In the present embodiment, alignment pins 22a–22d further include a narrow shoulder portion beneath heads 24a–24d. Backing plate 20 is formed of stainless steel in the present embodiment. However, the present invention is also well suited to having backing plate 20 formed of other material. Furthermore, in the present embodiment, alignment pin 22d is larger than remaining alignment pins 22a–22c. Although such a size discrepancy is shown in the present embodiment, the present invention is also well suited to having all of alignment pins 22a–22d sized equally. FIG. 3 shows a top plan view of backing plate 20 and alignment pins 22a–22d.

With reference again to FIG. 2, the present embodiment further includes a gasket 26 having holes 28a–28d formed therethrough. A top plan view of gasket 26 is shown in FIG. 4. As shown in FIG. 2, holes 28a–28d are adapted to be aligned with alignment pins 22a–22d. The present invention is also well suited to having one of the holes sized larger than the remaining holes to accommodate receiving a larger sized alignment pin therethrough. Although a gasket 26 is shown in the present embodiment, the present invention is also well suited to an embodiment which does not include a gasket.

With reference again to FIG. 2, the present heat sink assembly is typically used in conjunction with a substrate 30 such as, for example, a printed circuit board having holes 32a–32d formed therethrough. Additionally, the substrate used in conjunction with the present heat sink assembly is well suited to having one of holes 32a–32d sized larger than the remaining holes to accommodate receiving a larger sized alignment pin therethrough. As shown in FIG. 2, substrate 30 also has a heat generating device 34, such as, for example an integrated circuit chip attached thereto. A top plan view of a substrate 30 with a heat generating device 34 attached thereto is shown in FIG. 5. Although a printed circuit board comprises the substrate used in conjunction with the present heat sink assembly in the present embodiment, the present invention is also well suited to having a substrate 30 which is other than a printed circuit board. Furthermore, although an integrated circuit device is mentioned in the above description, the present heat sink assembly is also well suited for use with numerous other heat generating device such as, for example, capacitors, transformers, or even to cool "hot spots" on the substrate.

Referring again to FIG. 2, the present heat sink assembly further includes a heat sink unit 36 which is adapted to thermally contact heat generating device 34. In the present embodiment where heat sink unit 36 is an integrated circuit chip, heat sink unit 36 contains a recessed region therein for receiving chip 34. Heat sink unit 36 is formed, for example, of aluminum or other heat dissipating material. Heat sink unit 36 has holes 38a–38d formed therethrough. As shown in FIG. 2, holes 38a–38d are adapted to be aligned with alignment pins 22a–22d. Heat sink unit 36 is also well suited to having one of holes 38a–38d sized larger than the remaining holes to accommodate receiving a larger sized alignment pin therethrough. In the present embodiment, heat sink unit 36 has heat dissipating fins extending from the surface thereof. Although such fins are shown in the present embodiment, the present invention is also well suited to having heat sink unit 36 configured other than with fins. Likewise, the present heat sink assembly is also well suited to having heat sink unit 36 be thick or thin. The present heat sink assembly is also well suited to having a thermal pad, not shown, attached, for example, to the bottom surface of heat sink unit 36 or to the top surface of heat generating device 34. The thermal pad insures good thermal contact between heat sink unit 36 and heat generating device 34. FIG. 6 shows a top plan view of heat sink unit 36.

With reference again to FIG. 2, the present heat sink assembly further includes a clasp plate 40 having slits 42a–42d formed therethrough. As shown in FIG. 2, slits 42a–42d each have a wide end and a narrow end. Slits 42a–42d are adapted to be aligned with alignment pins 22a–22d. Clasp plate 40 is also well suited to having one of slits 42a–42d sized larger than the remaining slits to accommodate receiving a larger sized alignment pin. Clasp plate 40 is adapted to be disposed in the recessed region shown formed in the top surface of heat sink unit 36. Although clasp plate 40 is adapted to be disposed in the recessed region of heat sink unit 36 in the present embodiment, the present invention is also well suited to being disposed on top of a heat sink unit not having a recessed region therein. As with heat sink unit 36, in the present embodiment, clasp plate 40 is formed, for example, of aluminum or other heat dissipating material. In the present embodiment of the heat sink assembly, clasp plate 40 includes a opening 44 for receiving a screw fastener 46. Although a screw fastener 46 is used in the present embodiment, the present invention is also well Suited to the use of a fastener which is not a screw. A top plan view of clasp plate 40 is shown in FIG. 7. As shown in FIG. 7, in the present embodiment, clasp plate 40 further includes indicia 45 for quantitatively indicating the extent to which screw fastener 46 has been turned.

IN OPERATION

The following is a detailed description of the operation of the present invention. With reference next to FIG. 8, a side view of the exploded heat sink assembly of the present invention is shown. As shown in FIG. 8, the backing plate 20, gasket 26, substrate 30, heat sink unit 36, and clasp plate 40 are arranged such that alignment pins 22a–22d are aligned with holes in gasket 26, substrate 30, heat sink unit 36, and slits 42 of clasp plate 40. With reference now to FIG. 9, a side sectional view of the present exploded heat sink assembly of the present invention is shown. FIG. 9 clearly shows that in the present embodiment, heat sink unit 36 has a recessed region formed therein for receiving heat generating device 34. Thus, alignment pins 22a–22d of backing plate 20 are inserted through the holes in gasket 26, substrate 30, heat sink unit 36, and slits 42 of clasp plate 40. In so doing, backing plate 20, gasket 26, substrate 30, heat generating device 34, heat sink unit 36, and clasp plate 40 are positioned to be coupled together.

With reference next to FIG. 10, a top plan view of the assembled heat sink assembly of FIG. 2 with heads 24a–24d of alignment pins 22a–22d in the wide end of slits 42a–42d of clasp plate 40 is shown. The present invention is initially assembled by inserting the heads 24a–24d of alignment pins 22a–22d through gasket 26, substrate 30, heat generating device 34, heat sink unit 36, and the wide end of slits 42a–42d of clasp plate 40. In the present embodiment, the length of alignment pins 22a–22d is such that the narrow shoulder portion of the alignment pins 22a–22d resides is slits 42a–42d alignment pins 22a–22d are inserted through gasket 26, substrate 30, heat generating device 34, heat sink unit 36, and into slits 42a–42d of clasp plate 40. Next, the position of clasp plate 40 is adjusted as indicated such that the narrow end of alignment pins 22a–22d resides in the narrow end of the slits 42a–42d.

Referring now to FIG. 11, a top plan view of the assembled heat sink assembly of FIG. 2 with heads 24a–24d of the alignment pins 22a–22d grasped by the narrow end of slits 42a–42d. By adjusting the position of clasp plate 40 such that the narrow end of alignment pins 22a–22d resides in the narrow end of the slits 42a–42d, heads 24a–24d are grasped by the narrow end of slits 42a–42d. By grasping heads 24a–24d in the narrow end of slits 42a–42d, backing plate 20, gasket 26, substrate 30, heat generating device 34, heat sink unit 36, and clasp plate 40 are locked together. Next, fastener 46 is adjusted to compress backing plate 20, gasket 26, substrate 30, heat generating device 34, and heat sink unit 36 together. Specifically, as screw fastener 46 is turned, it pushes against heat sink unit 36. By forcing screw fastener 46 against heat sink unit 36, clasp plate 40 is pushed away from heat sink unit 36. Since heads 24a–24d are grasped by the narrow ends of slits 42a–42d, backing plate 20 is forced towards heat sink unit 36. As a result, backing plate 20, gasket 26, substrate 30, heat generating device 34, and heat sink unit 36 are compressed together.

With reference next to FIG. 12, a side sectional view of the assembled heat sink assembly of FIG. 2 taken through the midportion of the heat sink assembly of the present invention is shown. As shown in FIG. 12, the assembled present invention tightly compresses heat sink unit 36 against heat generating device 34.

Several substantial advantages are realized by the present invention. As an example, the present invention allows heat sink unit 36 to be removed from heat generating device 34 using only a single fastener device located in front of substrate 30. Thus, the present invention eliminates the need to access the back surface of substrate 30. Thus, access ports available in many computer systems and test consoles are useful. As a result, repair, testing, or replacement of heat generating device 34 is easily accomplished, thereby reducing the inconvenience and costs associated with prior art heat sinks.

As an additional advantage, fastener 46 uniformly attaches heat sink unit 36 to heat generating device 34. That is, unlike prior art heat sinks where numerous screws must be tightened to the same extent, the present invention requires the tightening of a single centrally located fastener. Hence, the present invention uniformly compresses heat sink unit 36 to heat generating device 34.

Furthermore, when heat sink unit 36 has alignment pins 22a–22d extended therethrough, heat sink unit 36 is oriented in a particular direction with respect to substrate 30. Thus, alignment pins 22a–22d of the present invention can be used to establish a particular orientation of heat sink unit 36 with respect to substrate 30.

Thus, the present invention provides a heat sink unit or assembly which can be attached to or detached from a heat generating device without accessing the back surface of the printed circuit board on which the chip is mounted. The present invention further provides a heat sink unit or assembly which insures uniform contact between a heat generating device and a heat sink unit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A removable heat sink assembly comprising:
    a heat sink unit thermally contacting a heat generating device which is disposed on a first surface of a substrate, said substrate having first holes formed therethrough, said heat sink unit having second holes formed therethrough, said second holes in said heat sink unit aligned with said first holes in said substrate;
    a backing plate having alignment pins extending therefrom and having heads disposed on distal ends thereof, said backing plate disposed proximate to a second surface of said substrate with said alignment pins extending through said first holes of said substrate and said second holes of said heat sink unit such that said substrate is disposed between said backing plate and said heat sink unit;

a clasp plate disposed proximate to said heat sink unit such that said heat sink unit is disposed between said clasp plate and said substrate, said clasp plate having slits disposed therethrough, said slits aligned with said second holes in said heat sink unit and said first holes in said substrate, said slits grasping said heads of said alignment pins; and a fastener coupled to said clasp plate, said fastener compressing said heat sink unit against said heat generating device.

2. The removable heat sink assembly of claim 1 wherein one of said alignment pins has a size which is different than the size of the other alignment pins.

3. The removable heat sink assembly of claim 2 wherein said first holes in said substrate, said second holes in said heat sink unit, and said slits in said clasp plate each have one hole or slit which has a size that is different than the size of the other holes or slits, said differently sized holes and slit being aligned for allowing said differently sized alignment pin to extend therethrough, such that said backing plate, said heat sink unit, and said clasp plate are oriented in a particular direction with respect to said substrate when said alignment pins extend through said substrate, said backing plate, said heat sink unit, and said clasp plate.

4. The removable heat sink assembly of claim 1 further comprising a gasket disposed between said backing plate and said substrate, said gasket having third holes formed therethrough said third holes in said gasket aligned with said first holes in said substrate.

5. The removable heat sink assembly of claim 1 wherein said substrate is comprised of a printed circuit board.

6. The removable heat sink assembly of claim 1 further comprising a thermally conductive pad disposed between said heat generating device and said heat sink unit, said thermally conductive pad insuring thermal contact between said heat generating device and said heat sink unit.

7. The removable heat sink assembly of claim 1 wherein said heat sink unit has fins extending from the surface thereof.

8. The removable heat sink assembly of claim 1 wherein said fastener is comprised of a screw.

9. The removable heat sink assembly of claim 1 wherein said fastener provides uniform compression of said heat sink unit and said backing plate towards each other such that said heat sink unit is uniformly pressed against said heat generating device.

10. The removable heat sink assembly of claim 1 further comprising indicia quantitatively indicating the compression provided by said fastener.

11. A method for removably coupling a heat sink unit to a heat generating device disposed on a front surface of a substrate without accessing a back surface of the substrate comprising the steps of:

inserting alignment pins of a backing plate from said back surface of a substrate through first holes in said substrate such that said alignment pins extend from said front surface of said substrate;

thermally coupling said heat sink unit having second holes formed therethrough to said heat generating device that is disposed on said front surface of said substrate such that said alignment pins extend through said second holes in said heat sink unit;

placing a clasp plate having grasping slits formed therethrough over said heat sink unit with said alignment pins extending into said grasping slits such that said heat sink unit is disposed between said clasp plate and said heat generating device; and adjusting a fastener coupled to said clasp plate to compress said heat sink unit and said backing plate towards each other or to release said heat sink unit from said backing plate such that said heat sink unit can be attached to or detached from said heat generating without having to have access to said back surface of said substrate.

12. The method for removably coupling a heat sink unit to a heat generating device a recited in claim 11 further comprising the step of:

placing a gasket having third holes formed therethrough between said backing plate and said substrate such that said alignment pins extend through said third holes in said gasket.

13. The method for removably coupling a heat sink unit to a heat generating device a recited in claim 11 further comprising the step of:

placing a thermally conductive pad between said heat generating device and said heat sink unit to insure thermal contact between said heat generating device and said heat sink unit.

14. The method for removably coupling a heat sink unit to a heat generating device a recited in claim 11 wherein said step of adjusting said fastener coupled to said clasp plate further includes adjusting said fastener to provide uniform compression of said heat sink unit and said backing plate towards each other such that said heat sink unit is uniformly pressed against said heat generating device.

15. An attachable and detachable heat sink assembly comprising:

a backing plate having alignment pins extending therefrom, said backing plate disposed adjacent to a back surface of printed circuit board having first holes formed therethrough receiving said alignment pins;

a heat sink unit thermally contacting a heat generating device that is disposed on a front surface of said printed circuit board, said heat sink unit having fins extending from a surface thereof, said heat sink unit having second holes formed therethrough, said second holes receiving said alignment pins of said backing plate;

a gasket disposed between said backing plate and said printed circuit board, said gasket having third holes formed therethrough said third holes in said gasket aligned with said first holes in said printed circuit board;

a clasp plate disposed adjacent to said heat sink unit on said front surface of said printed circuit board such that said heat sink unit is disposed between said clasp plate and said heat generating device, said clasp plate having slits formed therethrough, said slits grasping said alignment pins; and a fastener coupled to said clasp plate, said fastener compressing said heat sink unit and said backing plate towards each other such that said heat sink unit is tightly held against said heat generating device, said fastener further adapted to release said heat sink unit from said heat generating device such that said heat sink unit can be attached to or detached from said heat generating device without having to have access to said back surface of said printed circuit board.

16. The attachable and detachable heat sink assembly of claim 15 wherein one of said alignment pins has a size which is different than the size of the other alignment pins.

17. The attachable and detachable heat sink assembly of claim 16 wherein said first holes in said printed circuit board, said second holes in said heat sink, and said slits in said clasp plate each have one hole or slit which has a size that is different than the size of the other holes or slits, said differently sized holes and slit being aligned for allowing said differently sized alignment pin to extend therethrough, such that said backing plate, said heat sink unit, and said clasp plate are oriented in a particular direction with respect to said printed circuit board when said alignment pins extend through said printed circuit board, said backing plate, said gasket, said heat sink unit, and said clasp plate.

18. The attachable and detachable heat sink assembly of claim 15 further comprising a thermally conductive pad disposed between said heat generating device and said heat sink unit, said thermally conductive pad insuring thermal contact between said heat generating device and said heat sink unit.

19. The attachable and detachable heat sink assembly of claim 15 wherein said fastener provides uniform compression of said heat sink unit and said backing plate towards each other such that said heat sink unit is uniformly pressed against said heat generating device.

20. The attachable and detachable heat sink assembly of claim 15 further comprising indicia quantitatively indicating the compression provided by said fastener.

* * * * *